United States Patent
Chiou et al.

(10) Patent No.: US 6,699,755 B1
(45) Date of Patent: Mar. 2, 2004

(54) METHOD FOR PRODUCING A GATE

(75) Inventors: Da-Yen Chiou, Hsin-Chu Hsien (TW); Chun-Yuan Chen, Taipei Hsien (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 37 days.

(21) Appl. No.: 10/249,212

(22) Filed: Mar. 24, 2003

(51) Int. Cl.$^7$ .................. H01L 21/336; H01L 21/3205; H01L 21/4763

(52) U.S. Cl. .................. 438/258; 438/300; 438/301; 438/587

(58) Field of Search ........................ 438/300, 301, 438/201, 258, 261, 719, 587

(56) References Cited

U.S. PATENT DOCUMENTS 6,114,203 A * 9/2000 Ghidini et al. .............. 438/258
6,242,332 B1 * 6/2001 Cho et al. .................. 438/587
6,451,704 B1 * 9/2002 Pradeep et al. ............. 438/719
6,509,222 B1 * 1/2003 Grossi et al. ............... 438/201
6,551,880 B1 * 4/2003 Lai et al. .................... 438/261
6,603,171 B2 * 8/2003 Grossi et al. ............... 257/326

* cited by examiner

*Primary Examiner*—John F. Niebling
*Assistant Examiner*—Walter L. Lindsay, Jr.
(74) *Attorney, Agent, or Firm*—Winston Hsu

(57) ABSTRACT

A method for producing a gate on a semiconductor substrate. The semiconductor substrate has a first oxide layer, a conductive layer, a silicide layer, and a hard mask formed thereon. The method includes defining the hard mask to form a pattern of the gate, performing an etching process to remove portions of the silicide layer and the conductive layer which are not covered by the hard mask, performing an $O_2$ flush process to form a second oxide layer on the surface of the exposed first oxide layer, and performing a wet etching process to remove portions of the silicide layer to of give sidewalls of the silicide layer a concave shape and to etch back the second oxide layer.

11 Claims, 9 Drawing Sheets

METHOD FOR PRODUCING A GATE

BACKGROUND OF INVENTION

1. Field of the Invention

The invention relates to a method for producing a gate on a semiconductor substrate, and more particularly, to a method for producing a gate that will prevent bulging sidewalls of the gate produced by an annealing process.

2. Description of the Prior Art

Manufacturing a semiconductor IC comprises many process, such as the mask and photolithography process, coating, etching, and deposition. The progress of science and technology has led to high density of an IC in semiconductor manufacturing such that more transistors have to be set in a curtain area. For example, a silicon substrate with an area of 1–2 cm$^2$ may contain hundreds of thousands transistors. In order to avoid interference between transistors or short circuits, much research and design is needed to improve the above-mentioned processes of manufacturing a semiconductor. In addition, when manufacturing a transistor, the quality of the gate dielectric layer is a key point of the yield. A gate dielectric layer with bad quality is easily susceptible to breakdown and reduces the lifetime of a transistor. Therefore, improving the quality of a gate dielectric layer is an important issue.

The manufacturing method according to the prior art is illustrated below. Please refer to FIGS. 1–4, which are schematic diagrams of the formation of a gate on a semiconductor chip 10 according to the prior art. As shown in FIG. 1, an oxide layer 14 is formed on the silicon substrate 12 of the semiconductor chip 10 for serving as a dielectric layer of the gate. Then a doped polysilicon layer 16 and a silicide layer 18, for example, a WSi$_x$ layer, are formed sequentially on the oxide layer 14, wherein the doped polysilicon layer 16 is used for being a main conductive layer of the gate, and the silicide layer 18 is used for reducing resistance. After that, a mask layer 20 comprising silicon nitride (Si$_x$N$_y$) is formed on the surface of the silicide layer 18, and finally a photoresist layer 22 is formed on the mask layer 20.

Please refer to FIG. 2. A lithography process is then performed to define a pattern of the gate on the photoresist layer 22. After the lithography process, an anisotropic etching process, such as a dry-etching process, is performed to remove a portion of the mask layer 20 not covered by the photoresist layer 22 so as to transfer the pattern of the photoresist layer 22 to the mask layer 20. Then the remaining mask layer 20 is taken as a hard mask to etch the silicide layer 18 and the doped polysilicon layer 16, thereby forming the gate 24 and gate 26.

As shown in FIG. 3, the oxide layer 14 serves as a pad oxide layer for performing a first ion implantation process to form a plurality of doped areas (not illustrated) in the silicon substrate 12. Then a first annealing process is performed to activate the ions in the doped areas resulting in a plurality of lightly doped drains(LDD) 28 beside the gates 24 and 26. After that, a silicon nitride deposition is performed on the semiconductor chip 10 and an anisotropic etching process is performed to etch back portions of the silicon nitride sequentially to form a plurality of spacers 30 on the sidewalls of the gates 24 and 26, as shown in FIG. 4. Finally, a second ion implantation and a second annealing process are performed to form the source and drain 32 beside the gates 24 and 26. Therefore manufacturing of an MOS transistor is finished.

However, when performing the first and the second annealing process according to prior art, the suicide layer 18 in the gates 24 and 26 often becomes a bulging shape because of thermal expansion (please refer to FIG. 3). Thus the following silicon nitride layer will deposit along the bulging sidewalls of the silicide layer 18, resulting in the bulging spacers 30. As illustrated in FIG. 4, the distance between the gate 24 and the gate 26 is reduced because of the bulging shape of the gates 24 and 26. The reduced distance will influence the following processes of manufacturing the semiconductor chip. For example, when forming a contact plug between the gates 24 and 26, the dielectric material layer and conductive material layer later depositing between the gate 24 and gate 26 easily form an over hang, further resulting in more serious problems of shapeless covers, such as a void or a seam. In addition, the bulging shape of the gates 24 and 26 will also make the spacer 30 being over etched, possibly causing a short circuit between the gate and the contact plug.

Furthermore, a micro-loading effect easily occurs when using the dry etching to define the pattern of the gate 24, 26 on the semiconductor chip 10, which reduces the symmetry of etching. For example, to form a symmetric sidewall of a gate is difficult both in a dense region or an isolation region, as well as to control the line width accurately. Therefore, to eliminate the above problem is also a serious issue.

Consequently, there is a strong need to provide a semiconductor chip with a high integration while simultaneously avoiding the short distance between the gates resulting from bulging shapes of the spacers and the asymmetry caused by the dry etching.

SUMMARY OF INVENTION

It is therefore a primary objective of the claimed invention to provide a method for producing a gate on a semiconductor substrate to solve the above-mentioned problem.

According to the claimed invention, the claimed invention provides a method for producing a gate on a semiconductor substrate, wherein the semiconductor substratecomprises a first oxide layer, a conductive layer, a silicide layer, and a hard mask. The method comprises defining a pattern of the gate on the hard mask, performing an etching process to remove portions of the silicide layer and the conductive layer which are not covered by the hard mask, performing an O$_2$ flush process to form a second oxide layer on the surface of the first oxide layer, and performing a wet etching process to remove a portion of the silicide layer to give sidewalls of the silicide layer a concave shape and to etch back the second oxide layer.

It is an advantage of the claimed invention that an O$_2$ flush process is performed to raise the total thickness of the oxide layer before the wet etching, so that the thickness of remaining oxide layer after the wet etching is still great enough for being a pad oxide layer for protecting the semiconductor substrate from the ion implantation process even though the wet etching will remove portions of the oxide layer. Furthermore, because the claimed invention gives the both sidewalls of the silicide layer a concave shape, the gate will still have an approximately vertical structure even though the silicide layer undergoes thermal expansion during the annealing process. Therefore the above-mentioned problem resulting from the bulging shape of the gate will be effectively avoided.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
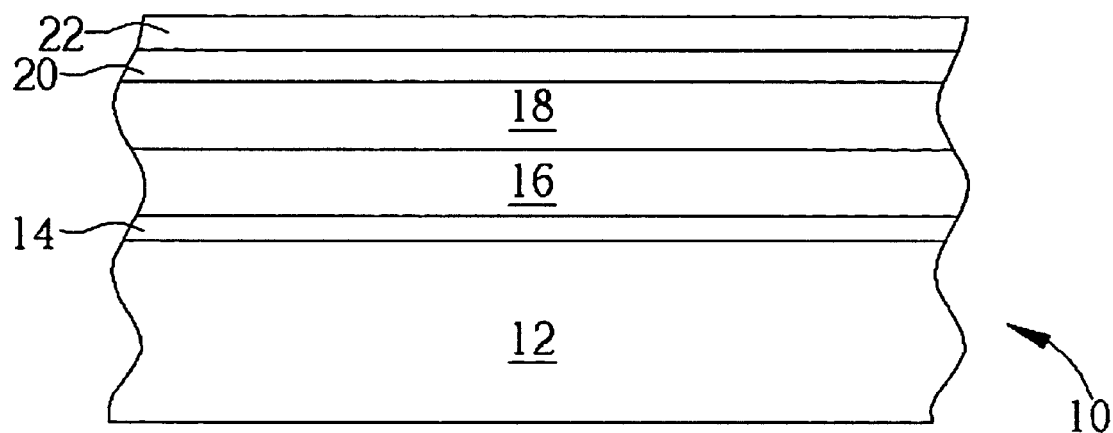
FIGS. 1–4 are the schematic diagrams of formation of a gate on a semiconductor chip according to the prior art.
Figure 2:
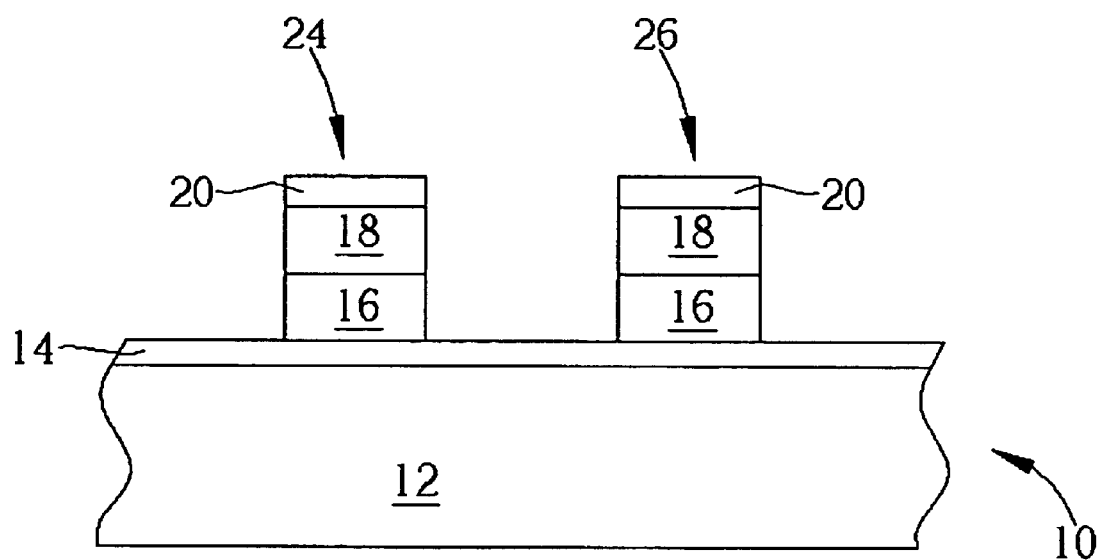
Figure 3:
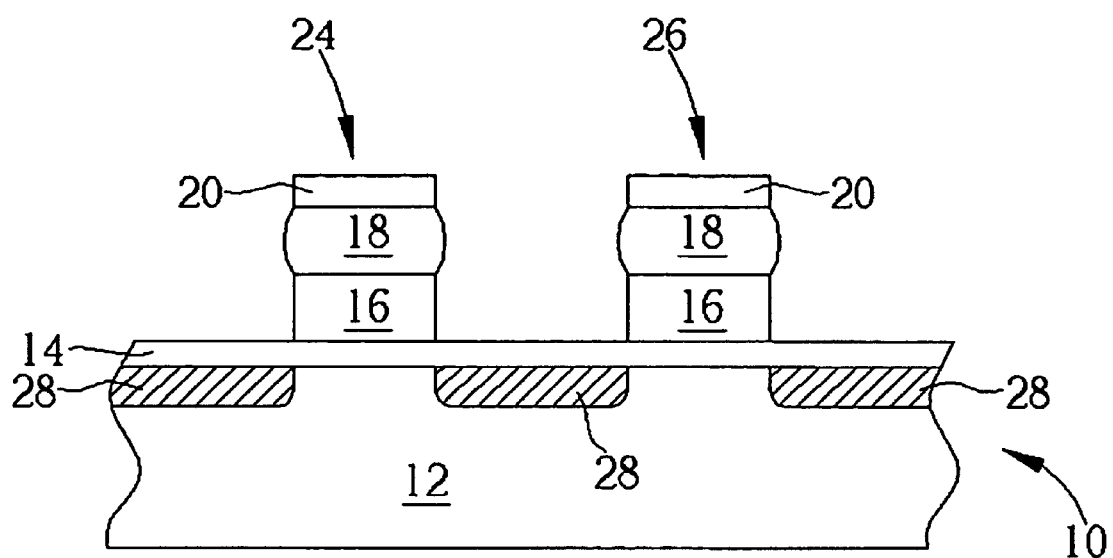
Figure 4:
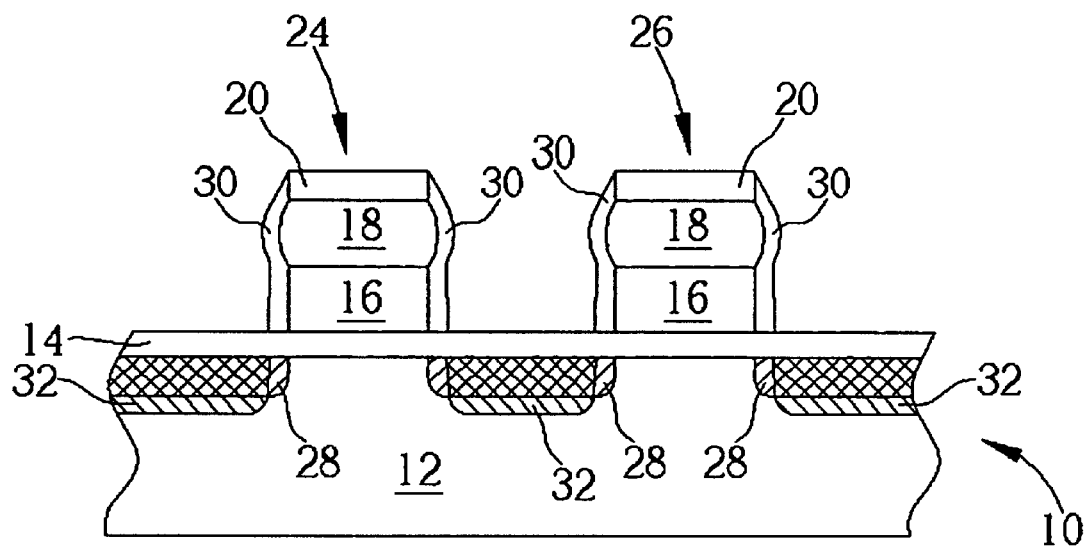
Figure 5:
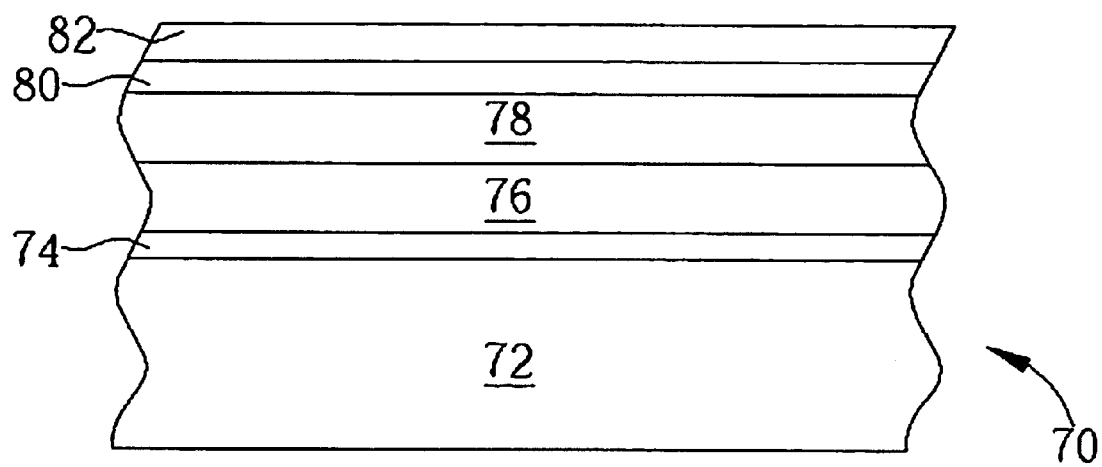
FIGS. 5–9 are the schematic diagrams of formation of a gate on a semiconductor chip according to the present invention.

Please refer to FIGS. 5–9. FIGS. 5–9 are the schematic diagrams of the formation of a gate on a semiconductor chip 70 according to the present invention. As shown in FIG. 5, a first oxide layer 74 is formed on the silicon substrate 72 of the semiconductor chip 70, wherein the first oxide layer 74 is used for being a gate oxide layer. Then a doped polysilicon layer 76, a silicide layer 78, a mask layer 80, and a photoresist layer 82 are sequentially formed on the first oxide layer 74. The first oxide layer 74 comprises $SiO_2$. The mask layer 80 comprises silicon nitride ($Si_xN_y$). The suicide layer 78 comprises tungsten silicide ($WSi_x$).

Figure 6:
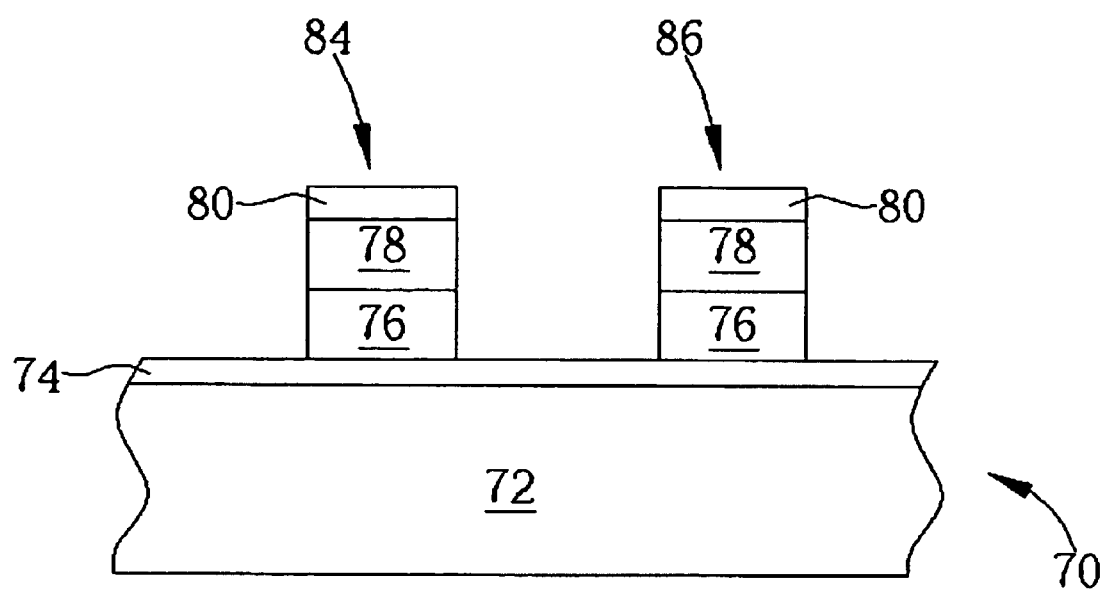

As illustrated in FIG. 6, a lithography process is preformed to define the gate pattern on the photoresist layer 82. Then the gate pattern is transferred to the mask layer 80 from the photoresist layer 82, and the photoresist layer 82 is removed. Taking the mask layer 80 as a hard mask, an anisotropic etching process is performed to remove the silicide layer 78 and the doped polysilicon layer 76 not covered by the mask layer 80.

Figure 7:
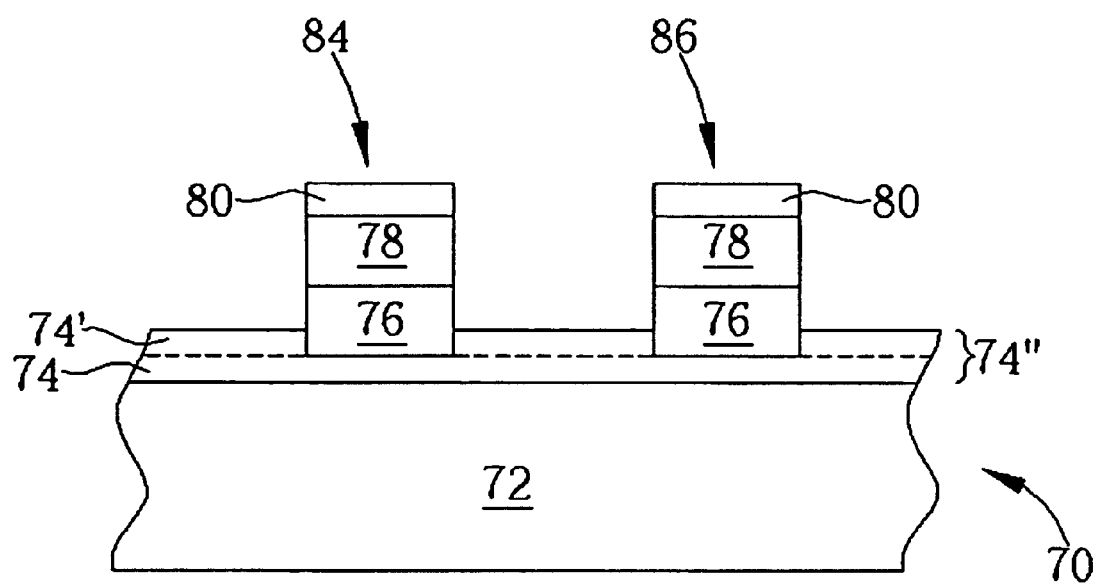
Figure 8:
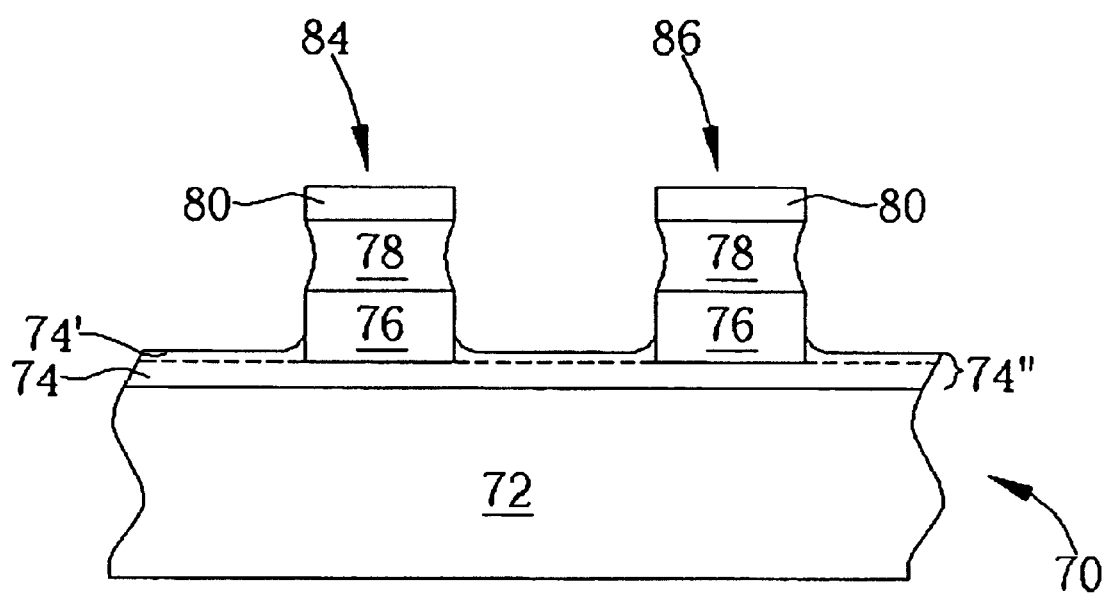
Figure 9:
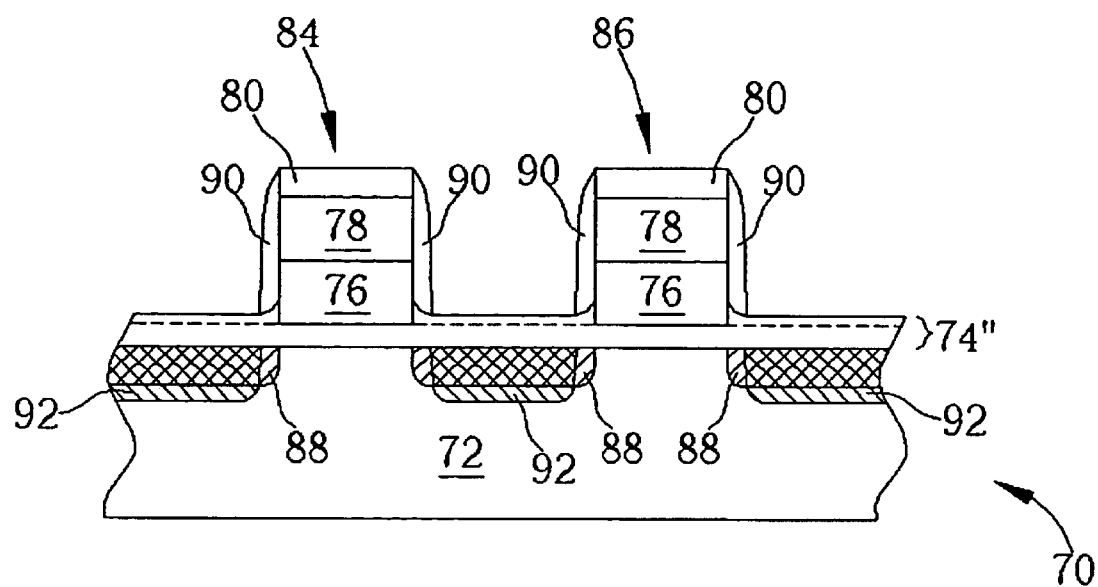

Then an $O_2$ flush process is performed on the surface of the silicon substrate 72 to form a second oxide layer 74", as shown in FIG. 7. An operator can control and increase the thickness of the total oxide layer 74" by the $O_2$ flush process. After that, an isotropic etching process, a wet etching, is performed to remove portions of the silicide layer 78 to give sidewalls of the silicide layer 78 a concave shape, and simultaneously etch back the second oxide layer 74", which reduces the thickness of the total oxide layer 74" to an appropriate thickness. Therefore the gates 84 and 86, shown in FIG. 8, are produced. FIG. 9 illustrates the finished product after the follow-up processes of the MOS transistor, wherein the MOS transistor may serve as a pass transistor of a memory cell of a dynamic random access memory (DRAM). The processes contain using the oxide layer 74" as a pad oxide layer to perform a first ion implantation process and a first annealing process for forming the LDDs 88 of the transistor, and forming the spacers 90 on the sidewalls of the gates 84 and 86. Finally a second ion implantation process and a second annealing process are performed to form the source and the drain 92.

Since the silicide layer 78 expands during the annealing process, the spacers 90 covering the sidewalls of the gates 84 and 86 show an approximately vertical shape, and it improves the problem of the shortage of the space between the gates 84 and 86. In addition, for preventing the small thickness of the oxide layer causing the isotropic etching process to etch portions of the first oxide layer 74, the present invention provides an $O_2$ flush process to form a second oxide layer 74" on the silicon substrate 72 before the isotropic etching process. Particularly, the second oxide layer 74" formed by the $O_2$ flush process has a higher density, so it has a high etching selectivity so that the second oxide layer 74" does not become too thin after the etching process. This means that the $O_2$ flush process can supply a thick enough oxide layer for use as a pad oxide layer to protect the silicon substrate 72 from damage.

It should be noticed that an operator could control the total thickness of the oxide layer to reach a most appropriate thickness by varying the amount of time used for the $O_2$ flush process in addition, the etching degree and thermal expansion of the sidewalls of the silicide layer 78 also can be adjusted with parameters according to the thickness of the silicide layer 78. Please refer to Table 1, which is a data list of oxide process performing time and thickness of an oxide layer after etching of the present invention. The after-etching thickness of an oxide layer with an $O_2$ flush process is thicker than an oxide layer without an $O_2$ flush process. Furthermore, there is a linear relationship between the remaining thickness and the performing time of the $O_2$ flush process. In other words, the more the performing time of the $O_2$ flush process is, the thicker of the remaining oxide layer is. Therefore the operator can obtain a preferable thickness by controlling the performing time of the $O_2$ flush process according to this relationship. The method is suitable for applying to either a dense pattern or an isolation pattern of the transistor.

TABLE 1

| SCF wafer | w/o Flush | $O_2$ Flush-30s | $O_2$ Flush-90s |
|---|---|---|---|
| Oxide Ave | 55.72 Å | 64.833 Å | 72.865 Å |
| Max. | 59.559 Å | 68.624 Å | 76.627 Å |
| Min. | 51.092 Å | 58.965 Å | 64.275 Å |

In another aspect, the present invention provides a thicker oxide layer on the surface of the source and drain without influence on the actual request of the thickness of a gate oxide layer, so that the present invention can be applied to DRAM, embedded DRAM, flash memory, or electrically erasable programmable read-only memory (EEPROM). The present invention may supply a shallower LDD or a source/drain to provide a higher integration for future process, and a denser pad oxide layer on the surface of the source and drain for avoiding the leakage of current, further effectively shortening the refresh frequency of various types of memory.

In contrast to the prior art, the present invention uses an isotropic etching process to improve the transistor to have a more uniform line width and to solve the problem of the distance between gates being too short, and also supplies a thick enough pad oxide layer to protect the silicon substrate from any damage caused by the follow-up process.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for producing a gate on a semiconductor substrate wherein a first oxide layer, a conductive layer, a silicide layer, and a hard mask are formed on the semiconductor substrate, the method comprising:

defining the hard mask to form a pattern of the gate;

performing an etching process to remove portions of the silicide layer and the conductive layer which are not covered by the hard mask so as to expose portions of the first oxide layer;

performing an $O_2$ flush process to form a second oxide layer on the surface of the exposed first oxide layer; and performing a wet etching process to remove a portion of the silicide layer to give sidewalls of the silicide layer a concave shape and to etch back the second oxide layer.

2. The method of claim 1 wherein the first oxide layer serves as a gate oxide layer of the gate, and the first oxide layer comprises silicon dioxide($SiO_2$).

3. The method of claim 1 wherein the conductive layer comprises a doped polysilicon layer.

4. The method of claim 1 wherein the etching process is a dry etching process.

5. A method for producing a metal oxide semiconductor (MOS) transistor on a semiconductor substrate, the method comprising:

forming a first oxide layer, a conductive layer, a silicide layer, and a hard mask sequentially;

defining the hard mask to form a gate pattern of the MOS transistor;

performing an etching process to remove portions of the silicide layer and the conductive layer which are not covered by the hard mask so as to expose portions of the first oxide layer;

performing an $O_2$ flush process to form a second oxide layer on the surface of the exposed first oxide layer;

performing a wet etching process to remove a portion of the silicide layer to give sidewalls of the silicide layer a concave shape and to etch back the second oxide layer for forming the gate structure of the MOS transistor; and performing an first ion implantation process to form a lightly doped drain (LDD) in the semiconductor substrate.

6. The method of claim 5 wherein the first oxide layer serves as a gate oxide layer of the gate, and the first oxide layer comprises a silicon dioxide.

7. The method of claim 5 wherein the first oxide layer not covered by the gate serves a pad oxide layer for reducing damage of the surface of the semiconductor substrate due to the ion implantation process.

8. The method of claim 5 wherein the conductive layer comprises a doped polysilicon layer.

9. The method of claim 5 wherein the etching process is a dry etching process.

10. The method of claim 5 wherein the MOS transistor serves as a pass transistor of a memory cell of a dynamic random access memory (DRAM).

11. The method of claim 5 further comprising a second ion implantation processfor forming a source and a drain of the MOS transistor on the semiconductor substrate after the LDD is formed.

* * * * *